United States Patent
Lee et al.

(10) Patent No.: US 12,550,678 B2
(45) Date of Patent: Feb. 10, 2026

(54) METHOD AND DEVICE FOR PLACING SEMICONDUCTOR WAFER

(71) Applicant: TAIWAN SEMICONDUCTOR MANUFACTURING COMPANY LTD., Hsinchu (TW)

(72) Inventors: Yung-Yao Lee, Hsinchu County (TW); Chen Yi Hsu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 826 days.

(21) Appl. No.: 17/461,076

(22) Filed: Aug. 30, 2021

(65) Prior Publication Data
US 2023/0061549 A1   Mar. 2, 2023

(51) Int. Cl.
*H01L 21/687* (2006.01)
*G03F 7/00* (2006.01)
*H01L 21/67* (2006.01)

(52) U.S. Cl.
CPC ...... *H01L 21/6875* (2013.01); *G03F 7/70716* (2013.01); *H01L 21/67109* (2013.01); *H01L 21/68742* (2013.01); *H01L 21/68757* (2013.01)

(58) Field of Classification Search
CPC .. G03F 7/70716; G03F 7/707; G03F 7/70733; H01L 21/67109; H01L 21/68742; H01L 21/6875; H01L 21/02175; H01L 21/31122; H01L 21/465; H01L 21/67103; H01L 21/67178; H01L 21/67288; H01L 21/68757
See application file for complete search history.

(56) References Cited

U.S. PATENT DOCUMENTS

| | | | |
|---|---|---|---|
| 8,767,178 B2 | 7/2014 | Lin et al. | |
| 8,796,666 B1 | 8/2014 | Huang et al. | |
| 8,802,354 B2 | 8/2014 | Chang | |
| 8,841,058 B2 | 9/2014 | Chang | |
| 8,895,234 B2 | 11/2014 | Chang et al. | |
| 9,046,789 B2 | 6/2015 | Lin et al. | |
| 9,093,530 B2 | 7/2015 | Huang et al. | |
| 9,128,384 B2 | 9/2015 | Lin et al. | |
| 9,287,234 B2 | 3/2016 | Wu et al. | |
| 9,548,303 B2 | 1/2017 | Lee et al. | |
| 10,192,772 B2* | 1/2019 | Achanta | ............. H01L 21/6831 |
| 11,282,726 B2* | 3/2022 | Tsai | .................... G01M 3/3254 |

(Continued)

FOREIGN PATENT DOCUMENTS

WO   WO-2017086333 A1 *  5/2017

*Primary Examiner* — Deoram Persaud
(74) *Attorney, Agent, or Firm* — WPAT LAW; Anthony King

(57) ABSTRACT

A method for processing a semiconductor wafer is provided. The method includes transferring the semiconductor wafer above a wafer placement device having a plate to align an edge of the semiconductor wafer with a first buffer member positioned in a peripheral region of the plate and to align a center of the semiconductor wafer with a second buffer member positioned in a central region of the plate. Each of the first buffer member and the second buffer member has a stiffness that is less than that of the plate. The method further includes lowering down the semiconductor wafer to place the semiconductor wafer over the plate.

20 Claims, 14 Drawing Sheets

(56) References Cited

U.S. PATENT DOCUMENTS

| | | | | |
|---|---|---|---|---|
| 2002/0067585 A1* | 6/2002 | Fujiwara | ............. | H01L 21/6838 361/234 |
| 2003/0001103 A1* | 1/2003 | Kobayashi | .......... | H01L 21/6835 269/21 |
| 2007/0195306 A1* | 8/2007 | Yun | ......................... | G03F 7/707 355/72 |
| 2016/0154313 A1* | 6/2016 | Funabashi | ........... | H01L 21/6838 430/323 |
| 2016/0187791 A1* | 6/2016 | Houben | .............. | G03F 7/70716 355/72 |
| 2017/0277039 A1* | 9/2017 | Kawahara | ............. | G03F 7/7085 |
| 2018/0166314 A1* | 6/2018 | Ellis | .................... | H01L 21/6875 |
| 2022/0115260 A1* | 4/2022 | Maassen | ............. | G03F 7/70783 |
| 2022/0283505 A1* | 9/2022 | Schreuder | ............... | G03F 7/707 |
| 2022/0319903 A1* | 10/2022 | Liao | .................... | H01L 21/6838 |
| 2024/0011147 A1* | 1/2024 | Ceballos | ................. | C23C 14/50 |

\* cited by examiner

METHOD AND DEVICE FOR PLACING SEMICONDUCTOR WAFER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing one or more wafers as a "lot" with a series of wafer fabrication tools (i.e., "processing tools"). Each processing tool typically performs a single wafer fabrication task on the wafers in a given lot. For example, a particular processing tool may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing).

Although existing processing tools have been generally adequate for their intended purposes, they have not been entirely satisfactory in all respects. Consequently, there is a need for a processing tool and a method thereof for using it that provides a solution for processing ICs efficiently and stably.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
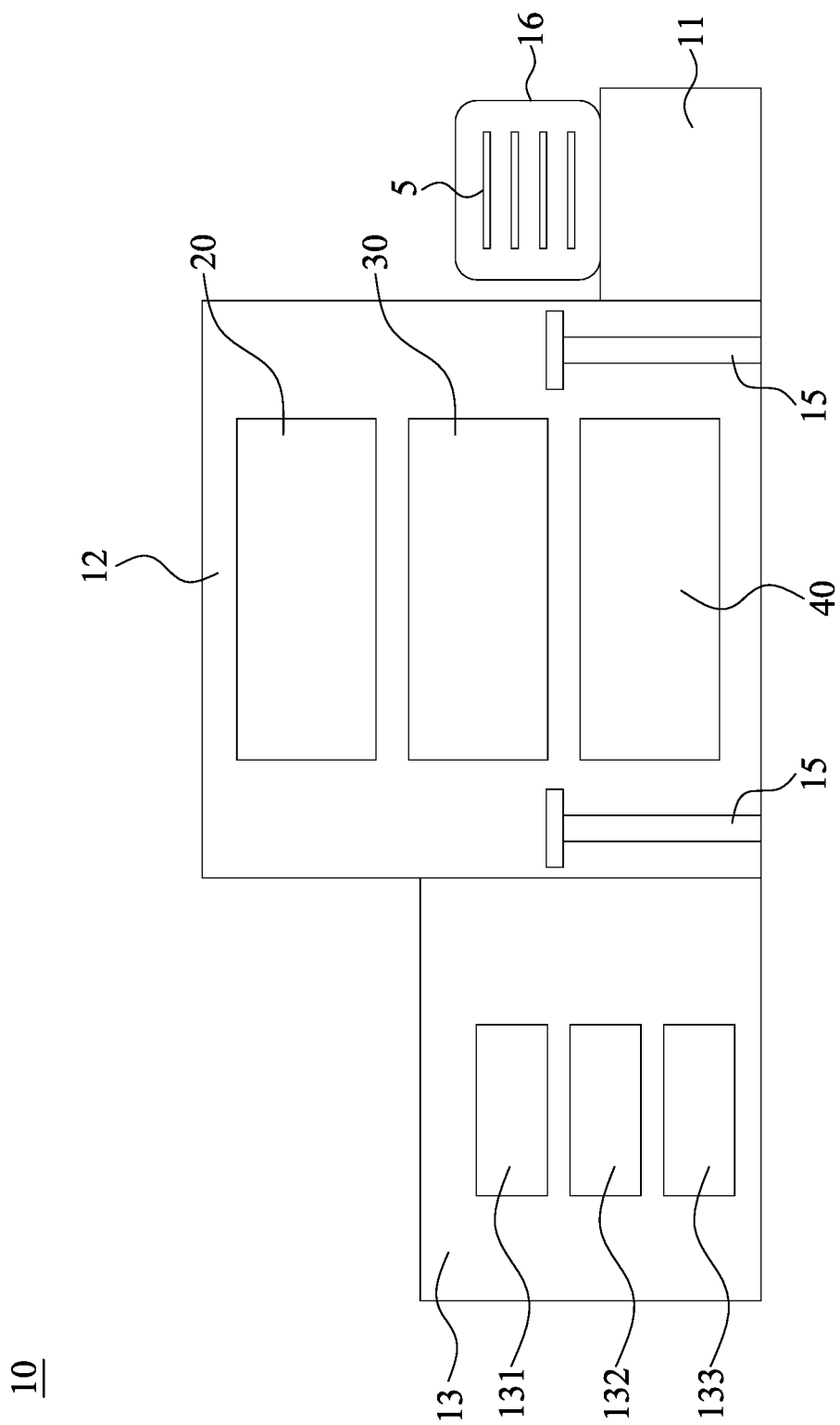
FIG. 1 shows a schematic view of a semiconductor processing system, in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

During the manufacturing of the semiconductor devices, various processing tools are used to fabricate integrated circuits on a semiconductor wafer. The semiconductor wafer is transferred among the processing tools automatically or manually and placed on a wafer placement device located in the processing tool. Existing devices and methods for transferring the semiconductor wafer often have difficulty in properly placing the semiconductor wafer to a surface of the wafer placement device when the semiconductor wafer has previously been warped due to previous processing thereof. If a collision of the semiconductor wafer and the wafer placement device occurs during the transferring, particles (e.g., debris of a coating formed on a surface of the wafer placement device) may contaminate the semiconductor wafer and lead to a degradation of a product yield of the semiconductor wafer.

FIG. 1 is a side view schematically illustrating a semiconductor processing system 10, in accordance with one or more embodiments of the present disclosure. In accordance with some embodiments, the semiconductor processing system 10 is a system configured for performing a lithography process, including photoresist coating process, exposure process, developing process and the any related process for the lithography process, over one or more semiconductor wafers 5. In some embodiments, the semiconductor processing system 10 includes a load port 11, a track unit 12, and a scanner 13. It is appreciated that the features described below can be replaced or eliminated in other embodiments of the lithographic system 1.

The semiconductor wafer 5 may made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes a photoresist layer. In some other embodiments, the semiconductor wafer 5 may be a silicon-on-insulator (SOI) or a germanium-on-insulator (GOI) substrate.

In some embodiments, the load port 11 is configured to receive a movable input/output wafer carrier, such as the wafer carrier 16 that carries a plurality of semiconductor wafers 5. The wafer carrier 16 may be a front opening unified pod (FOUP) or a standard mechanical interface (SMIF) pod. The load port 11 may be positioned adjacent to an opening formed on a housing of the track unit 12. Although FIG. 1 illustrates an embodiment that includes a load port 11 that is shared for incoming and outgoing wafers. The semiconductor processing system 10 may include two or more load ports, one or more of them is configured for incoming wafers, and the other of them is configured for outgoing wafers.

The track unit 12 is configured to conduct one or more processes before and after the semiconductor wafer 5 is processed by the scanner 13. In some embodiments, the track unit 12 includes a number of processing tools, such as processing tools 20, 30 and 40. In some embodiments, the processing tools 20, 30 and 40 are configured to perform different processes. In one exemplary embodiment, the processing tool 20 is a tool for performing a cooling process over the semiconductor wafer 5. The cooling process may be performed to cool down a temperature of the semiconductor wafer. For example, the cooling process is performed after a vapor deposition of hexamethyldisilizane (HMDS), after a soft baking process, after a post exposure baking process or after a hard baking process.

In one exemplary embodiment, the processing tool 30 is a tool for performing a heating process over the semiconductor wafer 5. The heating process is performed to increase a temperature of the semiconductor wafer 5. For example, the heating process includes a baking process that is performed after the coating of the photoresist (i.e., soft baking process), after an exposure process (i.e., post exposure baking process), after the development process (i.e. hard baking process.). In one exemplary embodiment, the processing tool 40 is a tool for performing a photoresist coating process over the semiconductor wafer 5. It will be appreciated that other tools can be added into the track unit 12, for example, a tool for performing a development process or the like.

In some embodiments, as shown in FIG. 1, the track unit 12 further includes one or more wafer transfer tools, such as wafer transfer tool 14 and wafer transfer tool 15. The wafer transfer tools 14 and 15 are configured to facilitate a wafer transfer between the scanner 13, the wafer carrier 16, the processing tool 20, the processing tool 30 and the processing tool 40. In some embodiments, the wafer transfer is carried out by the wafer transfer tools 14 and 15 which include one or more robotic arms. The robotic arm of the wafer transfer tool 14 transfers the semiconductor wafers 5 from the wafer carrier 16 to and from any one of the processing tools 20, 30 and 40 in the track unit 12. The semiconductor wafers 5 are typically loaded in the processing tools 20, 30 and 40 so their front side, on which semiconductor devices are formed, is facing upwards, while their backside, which is typically devoid of semiconductor device, is facing downward, but in other embodiments the wafers would be placed so their backside faces up and their front side faces down. The robotic arm of the wafer transfer tool 15 transfers the semiconductor wafers 5 from the scanner 13 to and from any one of the processing tools 20, 30 and 40 in the track unit 12. In other embodiments, each of the wafer transfer tools 14 and 15 can have one or more separate robotic arms.

Figure 2:
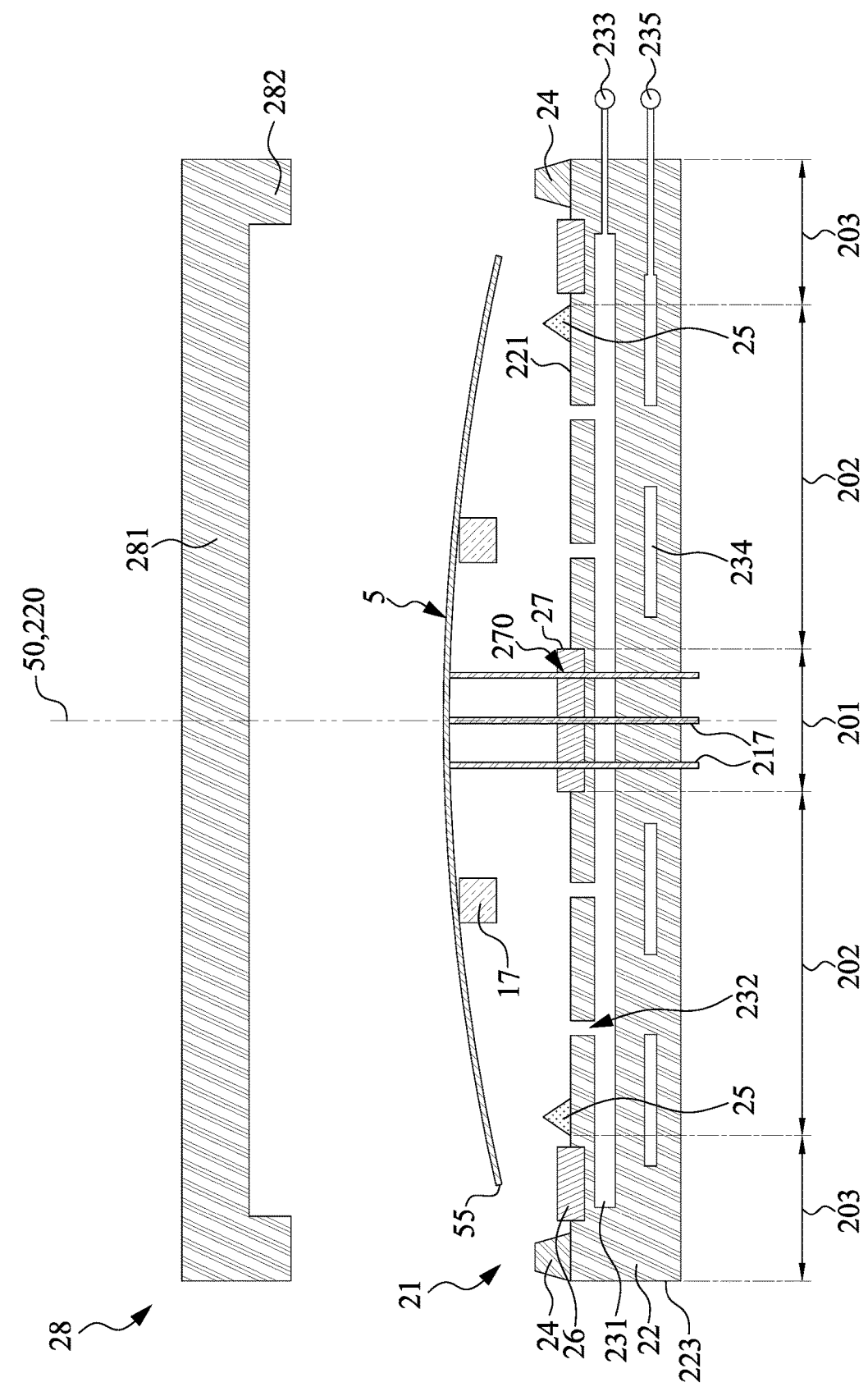
FIG. 2 shows a cross-section view of a processing tool, in accordance with some embodiments.

In some embodiments, each of the wafer transfer tools 14 and 15 includes a blade portion positioned on the robot arm and configured to handle the semiconductor wafer 5. For example, as shown in FIG. 2, a blade portion 17 of the wafer transfer tool 14 is inserted under a back surface of the semiconductor wafer 5, thereby being able to lift and move the semiconductor wafer 5. In some embodiments, the blade portion 17 is substantially U-shaped to minimize the amount of contact between the blade portion 17 and the semiconductor wafer 5. In some embodiments, one or more sensors are attached to the blade portion 17 to enhance the positioning of the blade portion 17 with respect to a wafer placement device 21 to prevent a collision between the semiconductor wafer 5 and the wafer placement device 21.

The scanner 13 is configured to perform an exposure process over the semiconductor wafer 5. In some embodiments, the semiconductor wafer 5 with the photoresist formed thereon is transferred (e.g., by the wafer transfer tool 15) on a wafer chuck 133 of the scanner 13 after the curing and drying of the photoresist. The scanner 13 will expose the photoresist to form an exposed region and an unexposed region within the photoresist. In some embodiments, the photoresist in the scanner 13 may be exposed by any suitable electromagnetic radiation generated by an energy source 131. For example, the energy source may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), an extreme ultraviolet lithography (EUV) radiation source (with a wavelength of 13.5 nm) or the like, although any other suitable source of energy, such as mercury vapor lamps, xenon lamps, carbon arc lamps, or the like, may alternatively be utilized. Before the electromagnetic radiation projects on the photoresist, the electromagnetic radiation passes through a patterned mask 132 to form a patterned energy that actually impinging upon the photoresist. In addition, one or more optics (not shown in figures) may be used to concentrate, expand, reflect, or otherwise control the electromagnetic radiation as it leaves the energy source 131, is patterned by the patterned mask 132, and is directed towards the photoresist.

Figure 3:
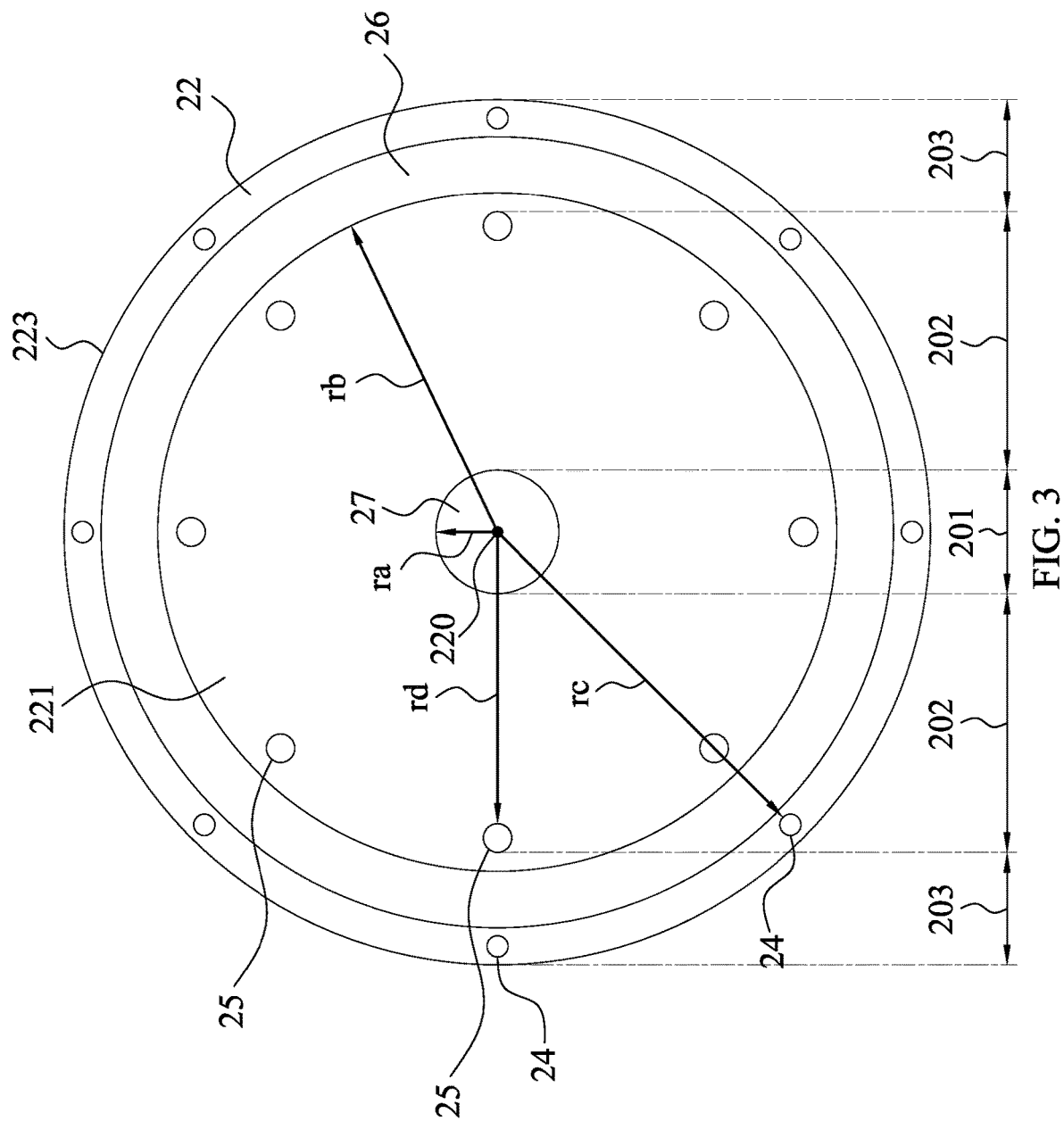
FIG. 3 shows a top view of a wafer placement device, in accordance with some embodiments.

FIG. 2 illustrates a cross-sectional view of a processing tool 20 with a semiconductor wafer 5 positioned above a wafer placement device 21, in accordance with some embodiments. FIG. 3 illustrates a top-down view of the wafer placement device 21, in accordance with some embodiments. In some embodiments, the wafer placement device 21 includes a plate 22, a cooling element 23, a number of spacers 24, a number of gap pins 25, one or more buffer members, such as first buffer member 26 and second buffer member 27, and a lid 28. It is appreciated that the features described below can be replaced or eliminated in other embodiments of the wafer placement device 21.

The plate 22 may have a circular plan-view shape as illustrated in FIG. 3. In some embodiments, the cooling element 23 is positioned in the plate 22 and is configured to cool the temperature of the plate 22 and, thus, the temperature of the semiconductor wafer 5 and photoresist in order to facilitate the photo lithography process. In some embodiments, the cooling element 23 includes a gas conduit 231 and a cooling loop 234, e.g. pipe, having an inlet and outlet (not shown). The gas conduit 231 and the cooling loop 234 are formed within the plate 22 and located underneath a top surface 221 of the plate 22.

The gas conduit 231 is connected to a gas source 233, and the cooling loop 234 is connected to the coolant source 235. A number of gas holes 232 are formed on the top surface 221 of the plate 22 and communicate with the gas conduit 231. In operation, the coolant source 235 circulates a coolant into the plate 22 through the cooling loop 234 so as to regulate the temperature of the plate 22. In addition, the gas source 233 supplies a gas into the gas conduit 231, and then the gas in the gas conduit 232 is discharged to the top surface 221 of the plate 22 through the gas holes 232. In some embodiments, the coolant that circulates within plate 22 is chilled water, but other coolants such as Gradient HT-70 and other commercially available and suitable coolants are used in other embodiments. In some embodiments, the gas supplied from the gas source 233 may have a high thermal conductivity so as to increase a heat exchange rate between the plate 22 and the semiconductor wafer 5. For example, the gas supplied from the gas source 233 includes, but not limited to, helium and argon. In some embodiments, the gas conduit 231, the gas holes 232 and the gas sources 233 are omitted. The heat between the semiconductor wafer 5 and the plate 22 is transferred through an ambient atmosphere.

In some embodiments, the plate 22 has a central region 201, an intermediate region 202 and a peripheral region 203. The central region 201, the intermediate region 202 and the peripheral region 203 are arranged in a radial direction of the plate 22 in sequence. In some embodiments, as shown in FIG. 2, when a semiconductor wafer 5 is position above the plate 22, the central region 201 aligns with a center 50 of the semiconductor wafer 5, the peripheral region 203 aligns with an edge 55 of the semiconductor wafer 5, and the intermediate region 202 is located between the central region 201 and the peripheral region 203. In some embodiments, the peripheral region 203 is located at an outermost portion and is adjacent immediately to an outer edge of the plate 22.

In some embodiments, as shown in FIG. 2 the lid 28 has an upper part 281 and an edge part 282 connected to an edge of the upper part 281 and extending toward the plate 22. When the lid 28 is lowered down, the spacers 24 are configured to support the lid 28 through the edge part 282. In some embodiments, the spacers 24 are positioned in the peripheral region 203 and arranged along the outer edge 223 of the plate 22. In one exemplary embodiment, as shown in FIG. 3, a distance rc between a center 220 of the plate 22 and one of the spacers 24 is in a range from about 150 mm to about 151 mm for supporting a 12-inch semiconductor wafer. The spacers 24 may be arranged in a circumferential direction of the plate 22 and distant from one the other by the same distance, as shown in FIG. 3. Alternatively, the spacers 24 may be arranged in a circumferential direction of the plate 22 with varied pitches.

Referring to FIG. 2, the gap pins 25 are configured to support the semiconductor wafer 5 when the semiconductor wafer 5 is placed over the wafer placement device 21, such that the semiconductor wafer 5 may not be in direct contact with the top surface 221 of the plate 22. In some embodiments, the gap pins 25 are positioned in the intermediate region 202 and arranged along a boundary of the intermediate region 202 and the peripheral region 203. In one exemplary embodiment, as shown in FIG. 3, a distance rd between the center 220 of the plate 22 and one of the gap pins 25 is in a range from about 147 mm to about 148 mm for supporting a 12-inch semiconductor wafer. The gap pins 25 may be arranged in a circumferential direction of the plate 22 and distant from one the other by the same pitch, as shown in FIG. 3. Alternatively, the gap pins 25 may be arranged in a circumferential direction of the plate 22 with varied pitches.

Figure 4:
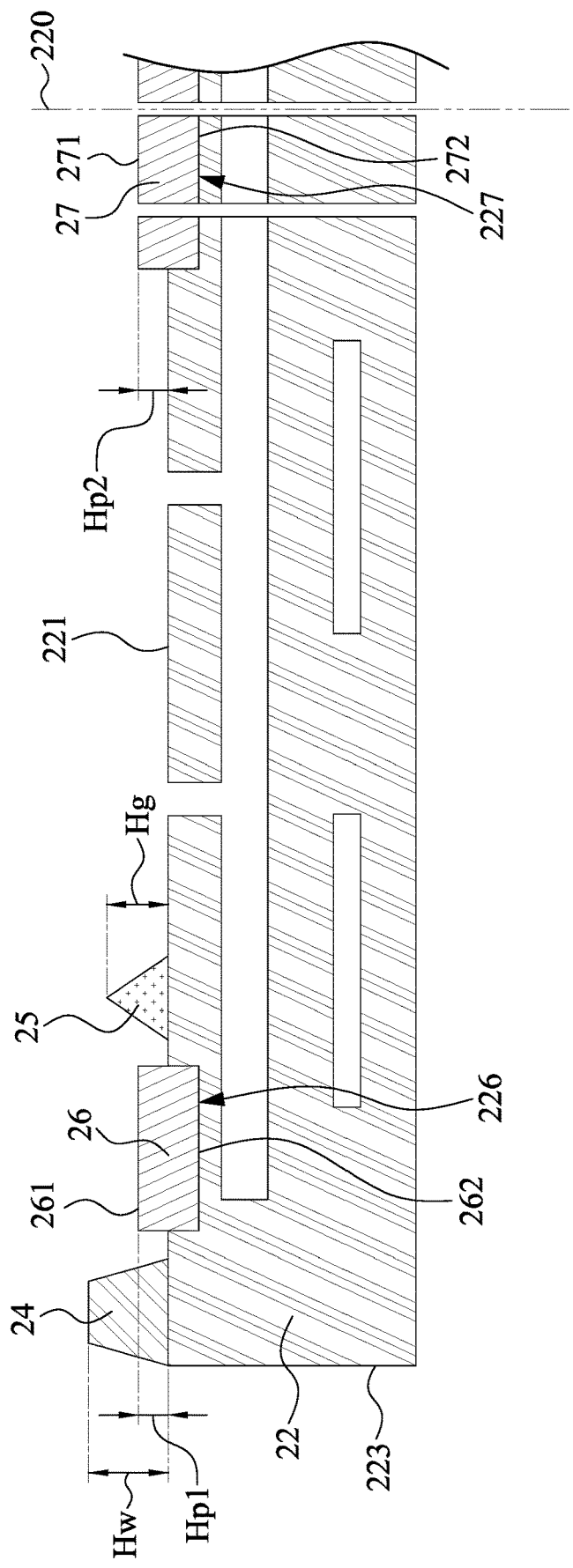
FIG. 4 shows a cross-section view of a portion of a wafer placement device, in accordance with some embodiments.

In some embodiments, as shown in FIG. 4, the spacers 24 are higher than the gap pins 25 relative to the top surface 221 of the plate 22 such that when the lid 28 (FIG. 2) is connected to the plate 22, an interference of the semiconductor wafer 5 and the lid 28 can be prevented. In one exemplary embodiment, a height Hw of each of the spacers 24 relative to the top surface 221 of the plate 22 is greater than 0.8 mm, and a height Hg of each of the gap pins 25 relative to the top surface 221 of the plate 22 is in a range from about 0.5 mm to about 0.8 mm.

The first buffer member 26 is configured to prevent an edge 55 of the semiconductor wafer 5 from rubbing with the peripheral region 203 of the plate 22 when the semiconductor wafer 5 is placed above the plate 22 or during a vertical movement of the semiconductor wafer 5 relative to the plate 22. In some embodiments, as shown in FIG. 2, the first buffer member 26 is positioned in the peripheral region 203 of the plate 22. The spacers 24 are positioned between the first buffer member 26 and the outer edge 223 of the plate 22. The first buffer member 26 may have a ring plan-view shape as illustrated in FIG. 3. In some embodiments, the first buffer member 26 is positioned between the gap pins 25 and the spacers 24 in the radial direction of the plate 22 and is spaced away from the spacers 24 and the gap pin 25. In some embodiments, as showing FIG. 3, a distance rb between the center 220 of the plate 22 and inner edge of the first buffer member 26 is greater than the distance rd but less than the distance rc. For example, the distance rb between the center 220 of the plate 22 and the inner edge of the first buffer member 26 is in a range from about 148 mm to about 149 mm. A width of the first buffer member 26 in the radial direction of the plate 22 is about 1 mm to about 2 mm.

The second buffer member 27 is configured to prevent the center 50 of the semiconductor wafer 5 from rubbing with the central region 201 of the plate 22 when the semiconductor wafer 5 is placed above the plate 22 or during a vertical movement of the semiconductor wafer 5 relative to the plate 22. In some embodiments, as shown in FIG. 2, the second buffer member 27 is positioned in the central region 201 of the plate 22. The gap pins 25 are positioned between the first buffer member 26 and the second buffer member 27. The second buffer member 27 may have a circular plan-view shape as illustrated in FIG. 3. In some embodiments, as showing FIG. 3, a radius ra of the second buffer member 27 is in a range from about 0 mm to about 5 mm.

Referring FIG. 4, in some embodiments, a top surface 261 of the first buffer member 26 is a planar surface, and a height Hp1 is lower than the height Hg of each of the gap pins 25. In addition, a top surface 271 of the second buffer member 27 is a planar surface, and a height Hp2 is lower than the height Hg of each of the gap pins 25. In one exemplary embodiment, each of the height Hp1 and the height Hp2 is in a range from about 0 mm to about 0.5 mm. The height Hp1 of the first buffer member 26 may be the same as the height Hp2 of the second buffer member 27. Alternatively, the height Hp1 of the first buffer member 26 may be different from the height Hp2 of the second buffer member 27. In one illustrated embodiment, the height Hp1 of the first buffer member 26 is higher than the height Hp2 of the second buffer member 27. In another illustrated embodiment, the height Hp1 of the first buffer member 26 is lower than the height Hp2 of the second buffer member 27.

In some embodiments, the plate 22 is made of a first material, and at least one of the first and second buffer members 26 and 27 is made of a second material. The first material has a higher stiffness than the second material. In some embodiments, the second material of the first and second buffer members 26 and 27 is has a pliable property such that when the semiconductor wafer 5 is rubbed with the first and second buffer members 26 and 27 the semiconductor wafer 5 is not scratched by the first and second buffer members 26 and 27. In one exemplary embodiment, the first material includes an alloy of Al, Fe, Ni, Cu, Mg, Ti or the like. The second material includes polyimide (PI) or any suitable material with high temperature resistance and soft characteristics.

In some embodiments, as shown in FIG. 4, a number of grooves, such as grooves 226 and 227 are formed on the top surface 221 of the plate 22 for receiving and fixing the first buffer member 26 and the second buffer member 27, respectively. Each of the grooves 226 and 227 are formed to have a shape compatible with one of the first buffer member 26 and the second buffer member 27 which is to be placed therein. In some embodiments, the first buffer member 26 and the second buffer member 27 are respectively placed in the groove 226 and the groove 227 in a tight-fit configuration. It will be noted that in cases where the first buffer member 26 and the second buffer member 27 are received in the groove 226 and the groove 227 in a tight-fit configuration, lower portions of the first buffer member 26 and the second buffer member 27 received in the groove 226 and the groove 227 may be compressed. As a result, the lower portions of the first buffer member 26 and the second buffer member 27 have less width than upper portions of the first buffer member 26 and the second buffer member 27 that are exposed by the grooves 226 and 227.

An adhesive may be applied in the grooves 226 and 227 to fix the first buffer member 26 and the second buffer member 27. In some embodiments, a depth of the groove 226 is the same as a depth of the groove 227. As a result, when the first buffer member 26 and the second buffer member 27 are respectively placed in the groove 226 and the groove 227, a bottom surface 262 of the first buffer member 26 and a bottom surface 272 of the second buffer member 27 are located in the same level. In some embodiments, the grooves 226 and 227 are omitted, and the first buffer member 26 and the second buffer member 27 are attached to the top surface 221 of the cool plate 22.

Referring to FIG. 2, in some embodiments, the processing tool 20 further includes a number of support pins 217 configured to place the semiconductor wafer 5 above the wafer placement plate 22. In some embodiments, the second buffer member 27 has a number of through holes 270. When the blade portion 17 transfers the semiconductor wafer 5 over the plate 22, the support pins 217 extend through the through holes 270 and move to a lift position, as shown in FIG. 2. In the lift position, the support pins 217 abut again a back surface of the semiconductor wafer 5, and then lift the semiconductor wafer 5 to a higher position so as to separate the semiconductor wafer 5 from the blade portion 17. Afterwards, the blade portion 17 is driven to move outside the processing tool 20, and the support pins 217 are driven to decrease the height of the semiconductor wafer 5 so as to place the semiconductor wafer 5 on the gap pins 25.

Figure 5:
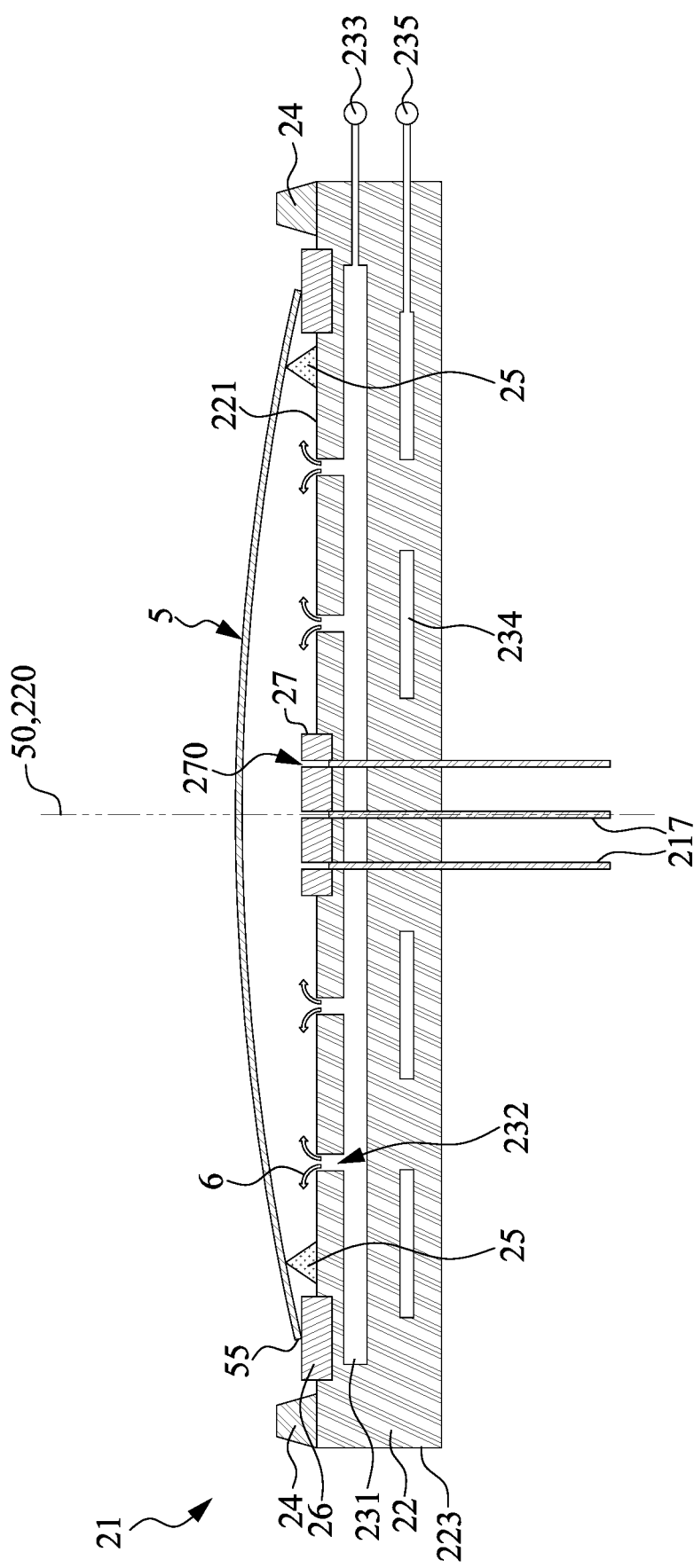
FIG. 5 shows a cross-section view of a wafer placement device as a semiconductor wafer is placed above the wafer placement device, in accordance with some embodiments.
Figure 6:
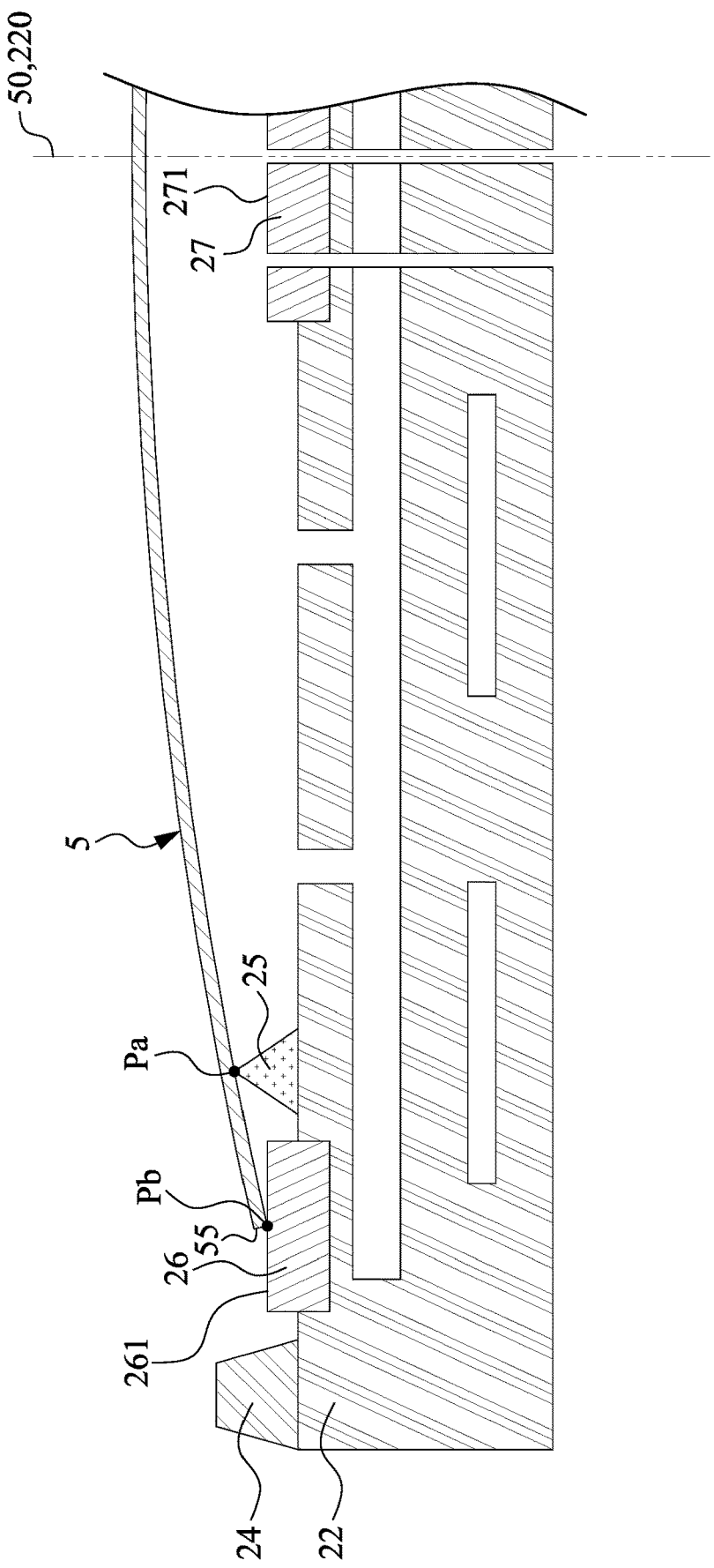
FIG. 6 shows a cross-section view of a portion of a wafer placement device as a semiconductor wafer is placed above the wafer placement device, in accordance with some embodiments.

In some embodiments, due to differences in thermal expansion coefficients of the material layers deposited on the semiconductor wafer 5, a warpage of wafer 5 occurs. If a resultant stress induced by thermal expansion is tensile, and the semiconductor wafer 5 bows itself downwardly as shown in FIG. 5. The warpage of the semiconductor wafer 5 leads the edge 55 of the semiconductor wafer 5 to be in contact with the wafer placement device 21 firstly during the downward movement of the support pins 217 and adversely causes scratches on the semiconductor wafer 5 and/or the plate 22. However, such scratches can be significantly avoided, by the arrangement of the first buffer member 26 over the plate 22. Specifically, as shown in FIG. 6, when the semiconductor wafer 5 is placed over the plate 22, the back surface of the semiconductor wafer 5 is supported by the gap pins 25, and at the same time at least a portion of the edge 55 of the semiconductor wafer 5 touches the first buffer member 26 rather than the top surface 221 of the plate 22. As a result, particles generated by the scratches of the semiconductor wafer 5 and the plate 22 can be avoided, thereby decreasing defects and increasing yield of semiconductor devices which are manufactured from the semiconductor wafer 5.

Figure 7:
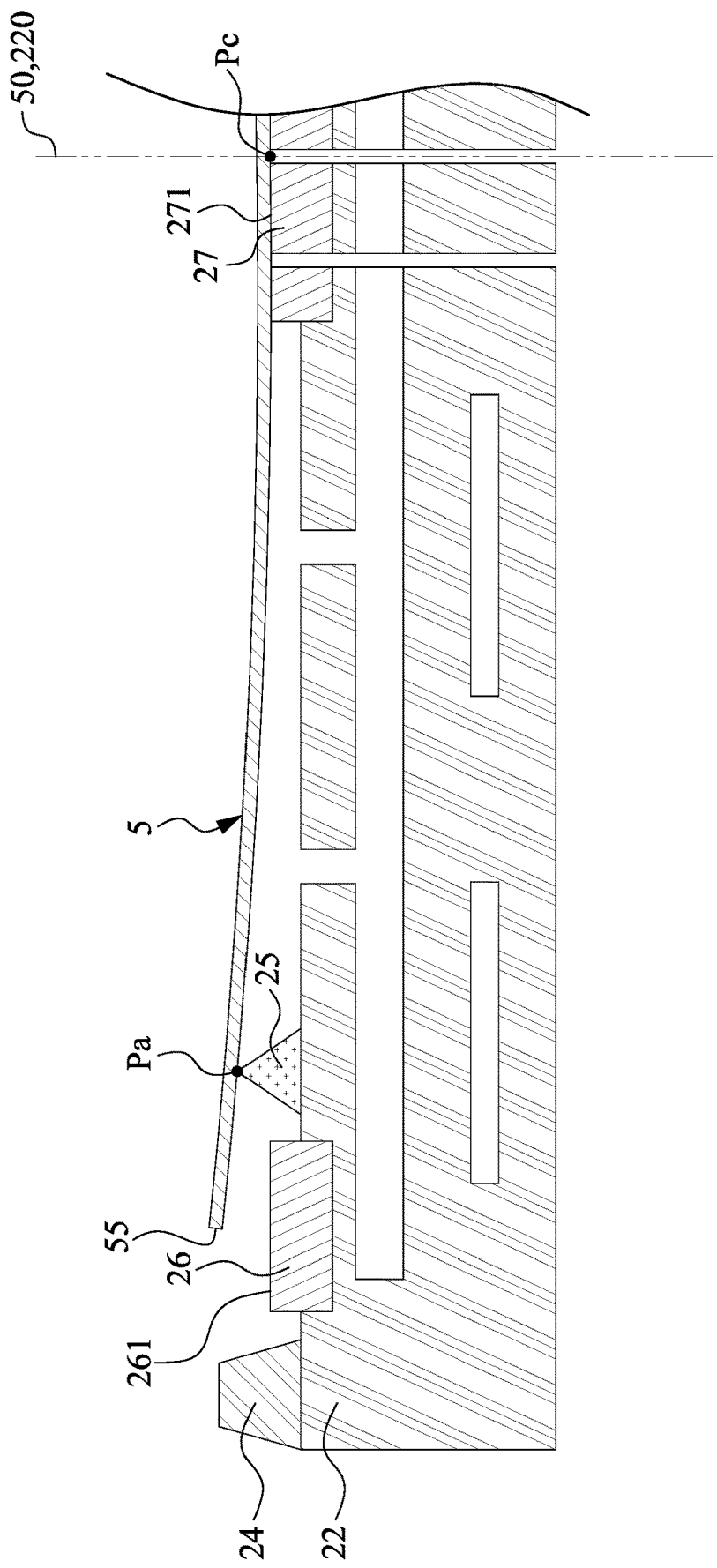
FIG. 7 shows a cross-section view of a portion of a wafer placement device as a semiconductor wafer is placed above the wafer placement device, in accordance with some embodiments.

On the contrary, if a resultant stress induced by thermal expansion is compressive, and the semiconductor wafer 5 bows itself upwardly as shown in FIG. 7. The warpage of the semiconductor wafer 5 leads the center 50 of the semiconductor wafer 5 or other portion around the center 50 to be in contact with the wafer placement device 21 firstly during the downward movement of the support pins 217 and adversely causes scratches on the semiconductor wafer 5 and/or the plate 22. However, such scratches can be significantly avoided, by the arrangement of the second buffer member 27 over the plate 22. Specifically, as shown in FIG. 7, when the semiconductor wafer 5 is placed over the plate 22, the back surface of the semiconductor wafer 5 is supported by the gap pins 25, and the center 50 of the semiconductor wafer 5 or other portion around the center 50 touches the second buffer member 27 rather than the top surface 221 of the plate 22. As a result, particles generated by the scratches of the semiconductor wafer 5 and the plate 22 can be avoided, thereby decreasing defects and increasing yield of semiconductor devices which are manufactured from the semiconductor wafer 5.

In some embodiments, the placement of the first and the second buffer members 26 and 27 produces no impact or slightly impact on the thermal conducting efficiency between the semiconductor wafer 5 and the plate 22. On the other hand, the placement of the first and the second buffer members 26 and 27, in accordance with some embodiments, can even increase the thermal conducting efficiency between the semiconductor wafer 5 and the plate 22. For example, in cases where a gas 6 is supplied between the semiconductor wafer 5 and the top surface 221 of the plate 22, the gas 6 is trapped by the first buffer member 26, as showing FIG. 5, and thus the gas 6 serves as a good and stable thermal conductor between the semiconductor wafer 5 and the top surface 221 of the plate 22. Therefore, a poor temperature uniformity of the semiconductor wafer 5 results from a varied distance between the semiconductor wafer 5 and the top surface 221 of the plate 22 due to the wafer warpage can be avoided.

The configuration of the wafer placement device 21 should not be limited to the embodiments above. Some exemplary embodiments of the wafer placement device are described below.

Figure 8:
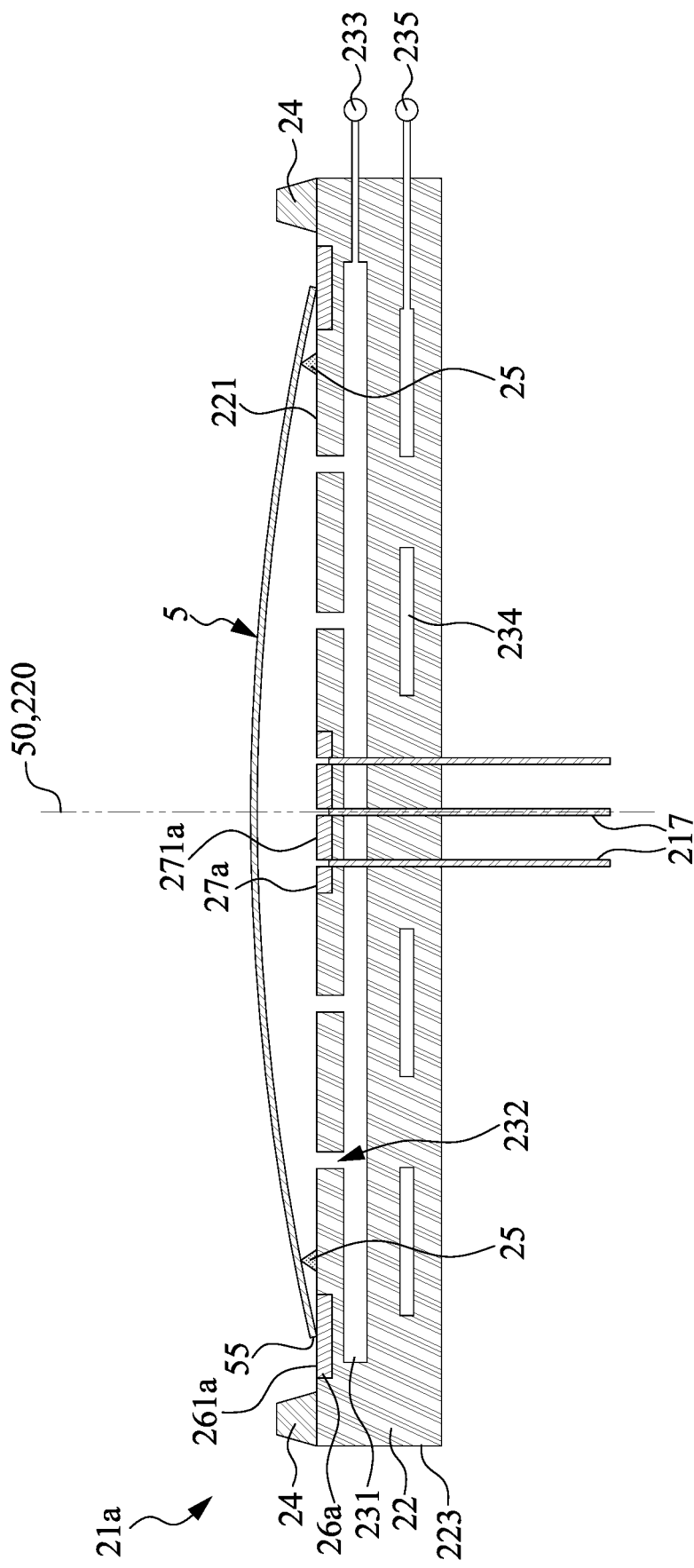
FIG. 8 shows a cross-section view of a wafer placement device as a semiconductor wafer is placed above the wafer placement device, in accordance with some embodiments.

FIG. 8 illustrates a cross-sectional view of a wafer placement device 21a with a semiconductor wafer 5 positioned thereon, in accordance with some embodiments. The components in FIG. 8 that use the same reference numerals as the components of FIG. 2 refer to the same components or equivalent components thereof. For the sake of brevity, it will not be repeated here. Differences between the wafer placement device 21a and the wafer placement device 21 include the first and second buffer members 26 and 27 being replaced with first and second buffer members 26a and 27a. In some embodiments, the first and second buffer members 26a and 27a have their top surface 261a and 271a be flush with the top surface 221 of the plate 22. By decreasing the height of the first and second buffer member 26a and 27a, the semiconductor wafer 5 having a greater warpage or having varied distortions in different regions still can be stably positioned above the plate 22.

Figure 9:
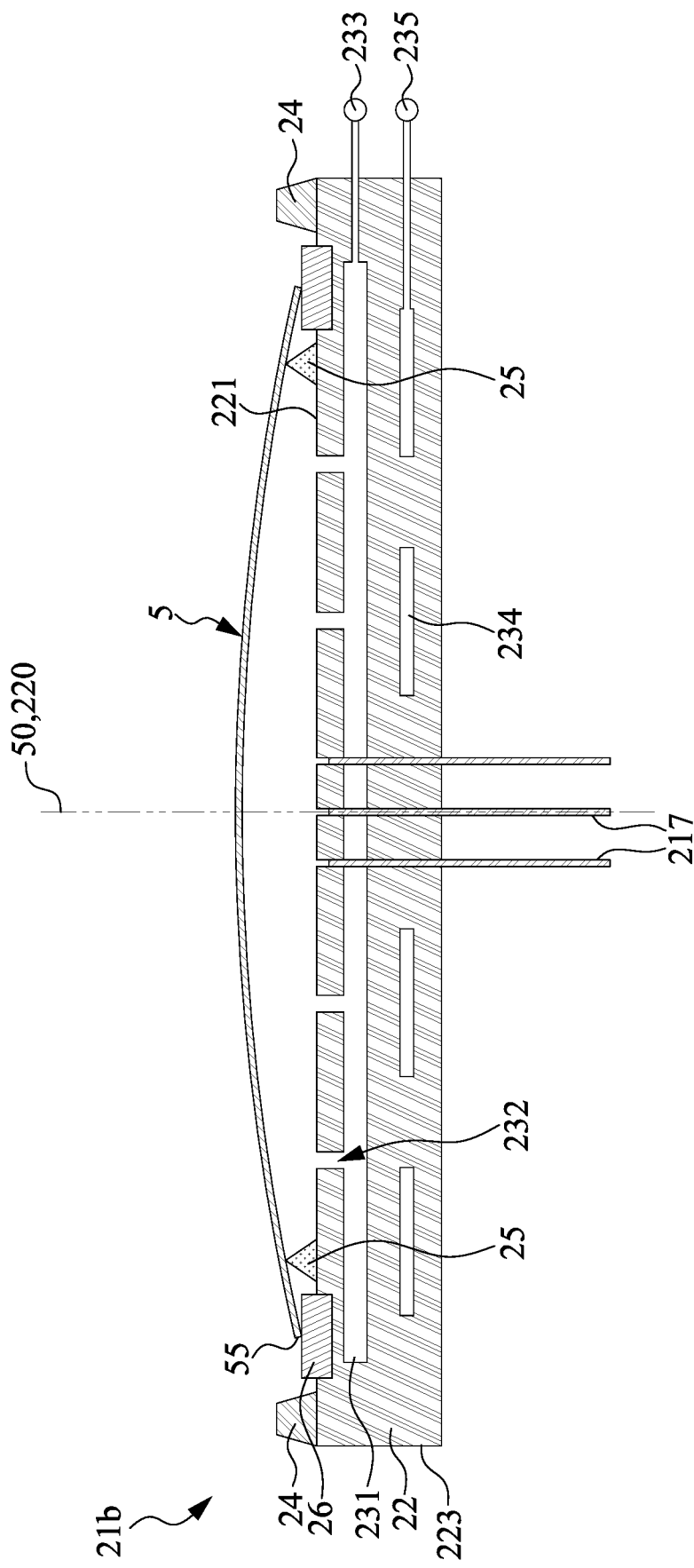
FIG. 9 shows a cross-section view of a wafer placement device as a semiconductor wafer is placed above the wafer placement device, in accordance with some embodiments.

FIG. 9 illustrates a cross-sectional view of a wafer placement device 21b with a semiconductor wafer 5 positioned thereon, in accordance with some embodiments. The components in FIG. 9 that use the same reference numerals as the components of FIG. 2 refer to the same components or equivalent components thereof. For the sake of brevity, it will not be repeated here. Differences between the wafer placement device 21b and the wafer placement device 21 include the second buffer member 27 being omitted. In some embodiments, the topography of the semiconductor wafer 5 is expectable, and thus one of the first and second buffer members 26 and 27 can be removed, thereby decreasing the manufacturing cost of the wafer placement device 21b. In addition, by increasing an exposed area of the top surface 221, there is no need to change parameters (e.g., a flowing rate of the coolant supplied to the coolant conduit 234) of the wafer placement device 21b and the thermal conducting efficiency between the semiconductor wafer 5 and the plate 22 can be sustained.

Figure 10:
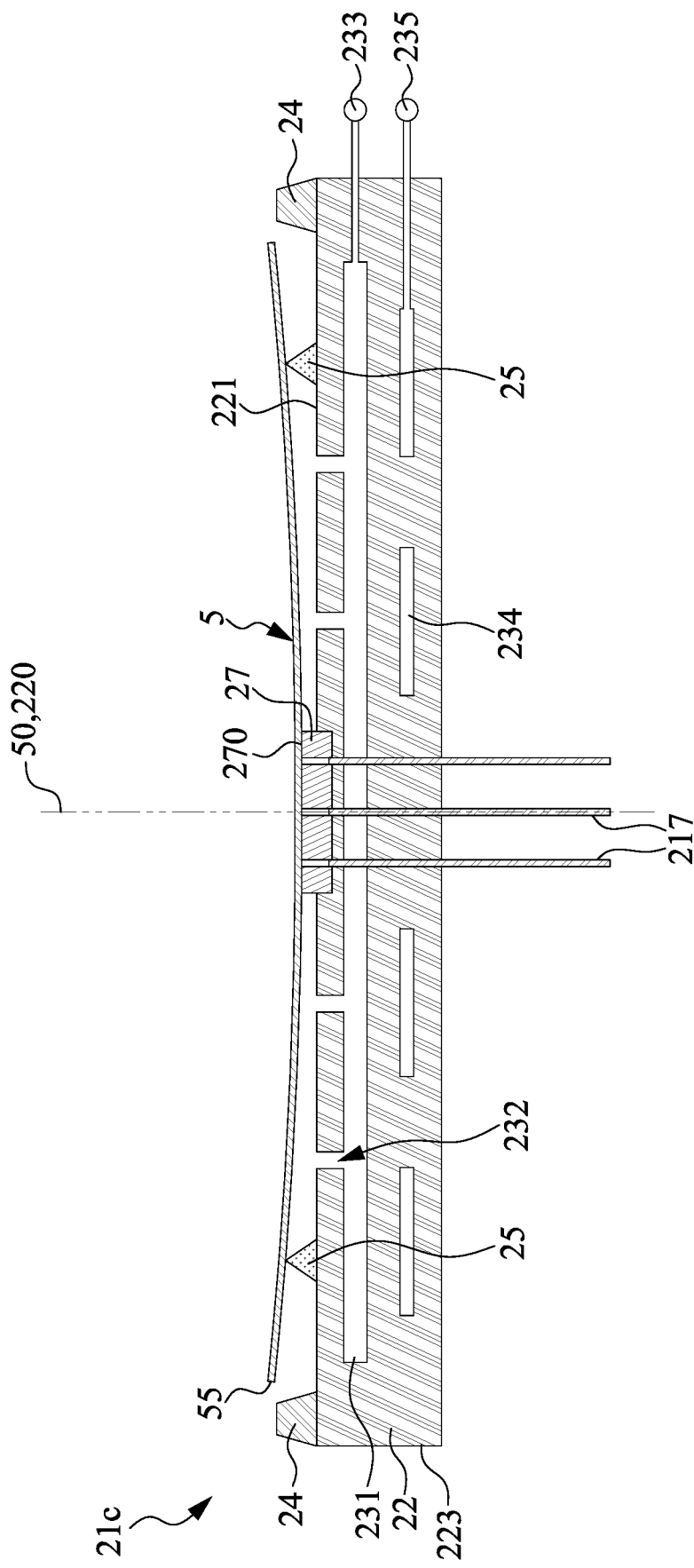
FIG. 10 shows a cross-section view of a wafer placement device as a semiconductor wafer is placed above the wafer placement device, in accordance with some embodiments.

FIG. 10 illustrates a cross-sectional view of a wafer placement device 21c with a semiconductor wafer 5 positioned thereon, in accordance with some embodiments. The components in FIG. 10 that use the same reference numerals as the components of FIG. 2 refer to the same components or equivalent components thereof. For the sake of brevity, it will not be repeated here. Differences between the wafer placement device 21c and the wafer placement device 21 include the first buffer member 26 being omitted. In some embodiments, the topography of the semiconductor wafer 5 is expectable, and thus one of the first and second buffer members 26 and 27 can be removed, thereby decreasing the manufacturing cost of the wafer placement device 21c. In addition, by increasing an exposed area of the top surface 221, there is no need to change parameters (e.g., a flowing rate of the coolant supplied to the coolant conduit 234) of the wafer placement device 21c and the thermal conducting efficiency between the semiconductor wafer 5 and the plate 22 can be sustained.

Figure 11:
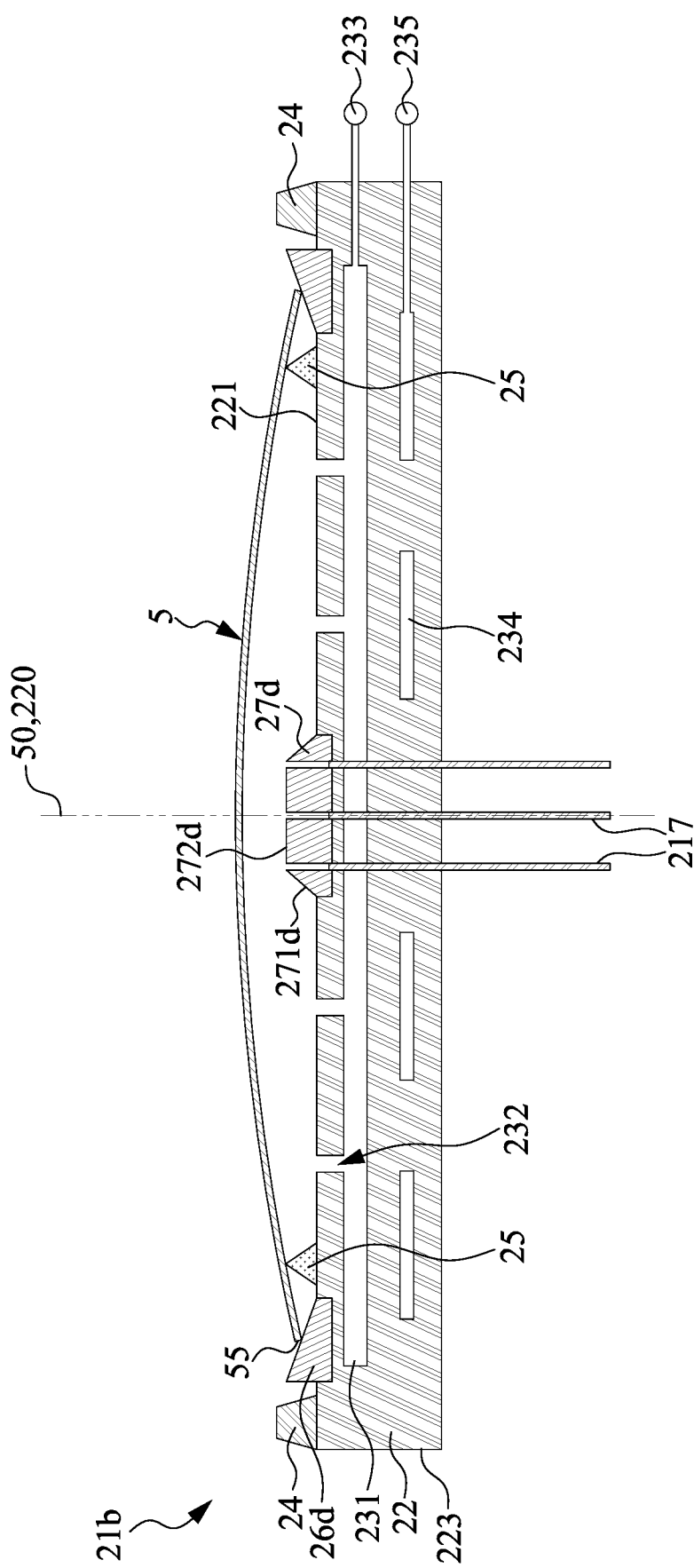
FIG. 11 shows a cross-section view of a wafer placement device as a semiconductor wafer is placed above the wafer placement device, in accordance with some embodiments.

FIG. 11 illustrates a cross-sectional view of a wafer placement device 21d with a semiconductor wafer 5 positioned thereon, in accordance with some embodiments. The components in FIG. 11 that use the same reference numerals as the components of FIG. 2 refer to the same components or equivalent components thereof. For the sake of brevity, it will not be repeated here. Differences between the wafer placement device 21d and the wafer placement device 21 include the first and second buffer members 26 and 27 being replaced with first and second buffer members 26d and 27d.

In some embodiments, the first buffer member 26d has a trapezoidal cross section and is beveled toward an inner side of the first buffer member 26a. That is, a height of an inner side of the first buffer member 26d is less than a height of an outer side of the first buffer member 26d. A top surface 261d is inclined relative to the top surface 221 of the plate 22 and may meet with the top surface 221 of the plate 22 at its lower end. In addition, the second buffer member 27 has a flat cone-shaped cross section and includes a first top surface 271d and a second top surface 272d. The first top surface 271d extends parallel to the top surface 221 of the plate 22, and the second top surface 272d is inclined relative to the top surface 221 of the plate 22. The second top surface 272d may meet with the top surface 221 of the plate 22 at its lower end.

Figure 12:
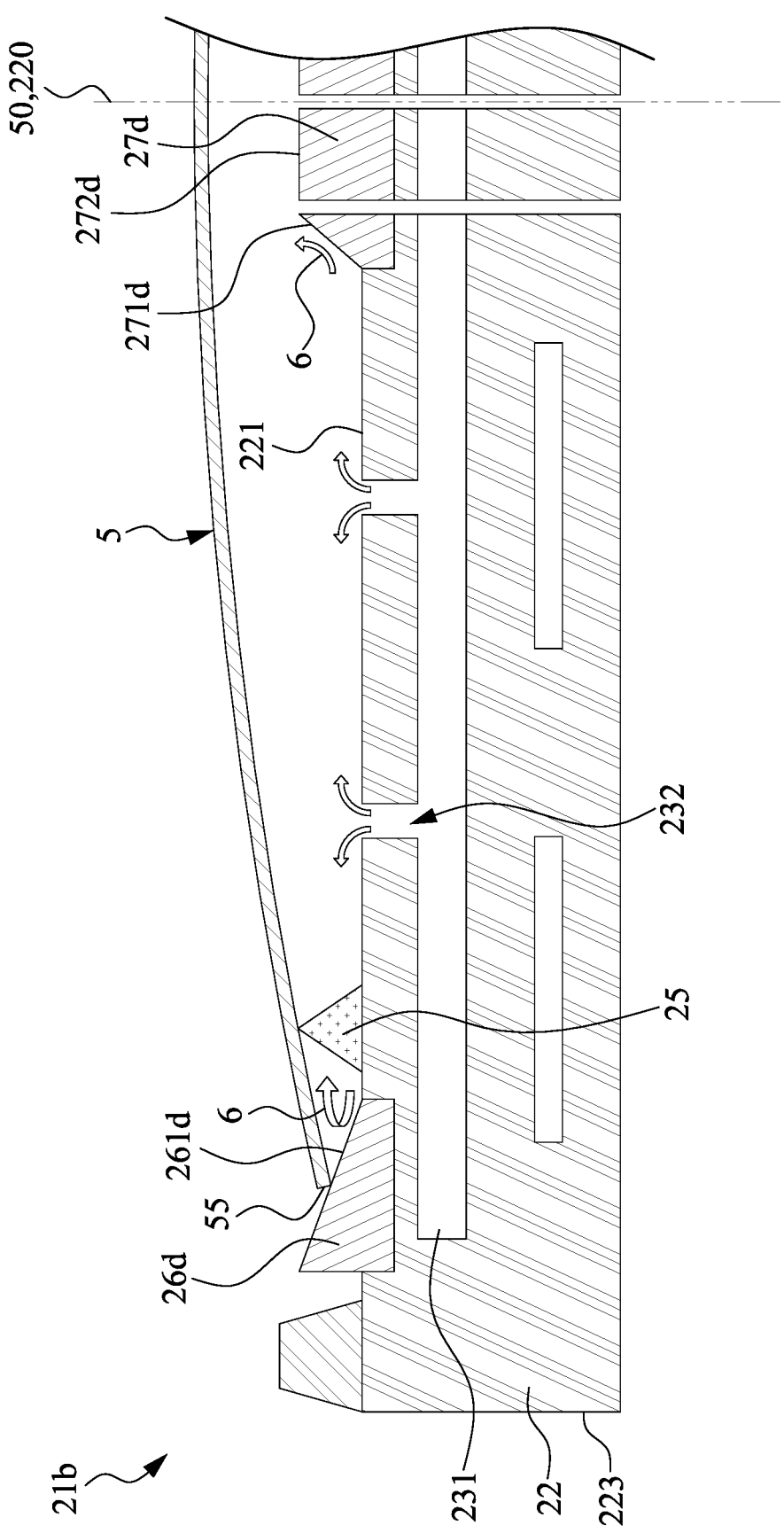
FIG. 12 shows a cross-section view of a portion of a wafer placement device as a semiconductor wafer is placed above the wafer placement device, in accordance with some embodiments.

FIG. 12 shows one of stages of a method of cooling the semiconductor wafer 5 by placing the semiconductor wafer 5 over the wafer placement device 21d. In some embodiments, gas 6 is discharged to the top surface 221 of the plate 22 through the coolant conduit 231 and the gas holes 232. The gas 6 flows in a gap between the semiconductor wafer 5 and the top surface 221 of the plate 22. As shown in FIG. 12, when the flow of gas 6 strikes against the top surface 261d of the first buffer member 26, a turbulence of the flow of gas 6 occurs on the top surface 261d, which causes the thermal energy from the plate 22 can be efficiently transferred to regions of the semiconductor wafer 5 that is located in the vicinity of the edge 55. As a result, temperature uniformity over the semiconductor wafer 5 can be improved. Furthermore, when the flow of gas 6 strikes against the second top surface 272d of the second buffer member 27, the flow of gas 6 may flow along the second top surface 272d and enters a gap between the first top surface 271d and the center 50 of the semiconductor wafer 5. Therefore, the flow of gas 6 can fluently flowing across the entire surface of the top surface 221 of the plate 22 regardless the disposition of the second buffer member 27d.

It will be appreciated that while the first buffer member 26 and the second buffer member 27 illustrated in the above mentioned embodiments are used in a wafer placement device for cooling the semiconductor wafer 5, the first buffer member 26 and the second buffer member 27 can be implemented in any wafer placement device in the semiconductor processing system 10.

Figure 13:
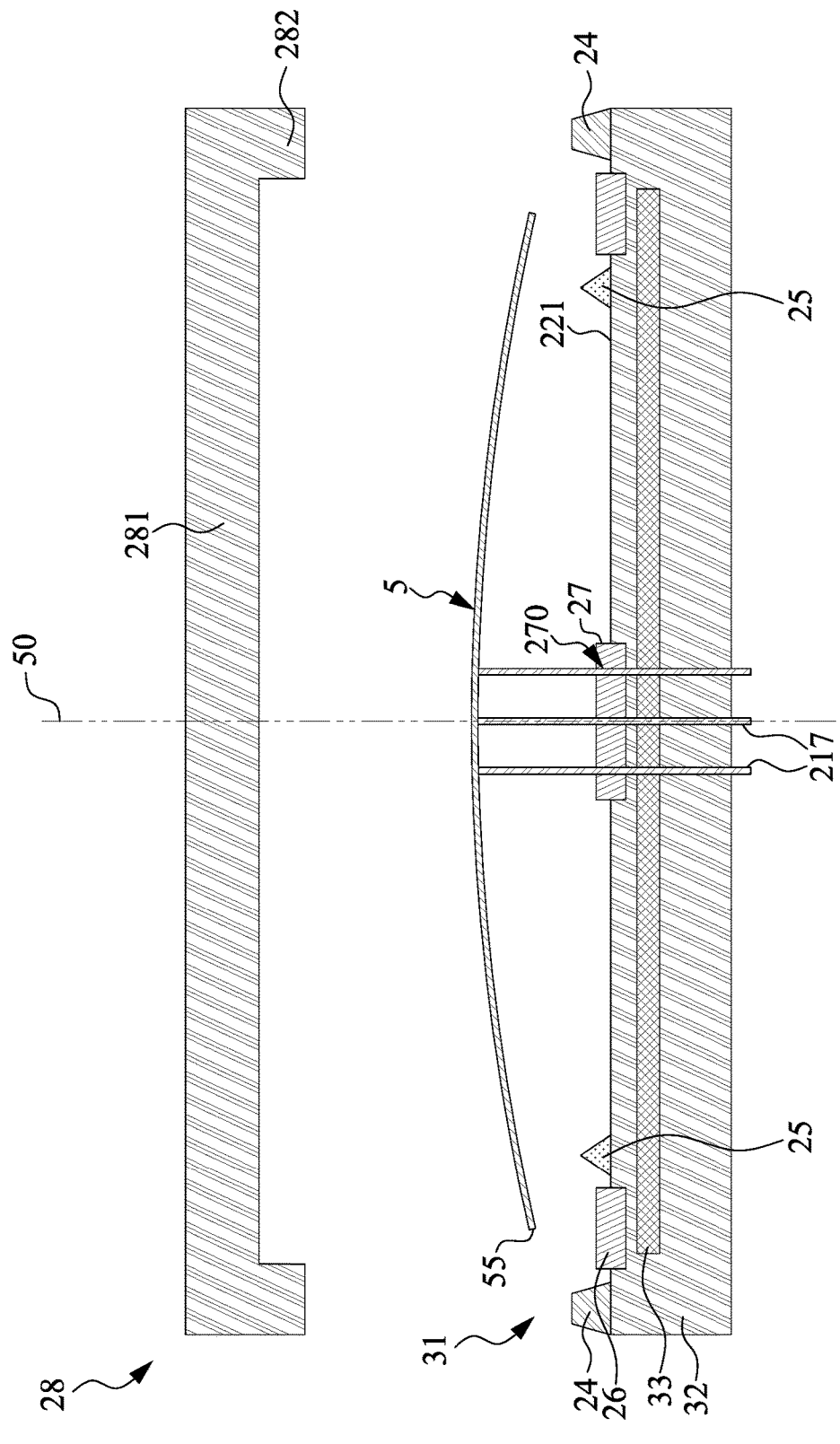
FIG. 13 shows a schematic view of a processing tool, in accordance with some embodiments.

FIG. 13 illustrates a cross-sectional view of the processing tool 30 with a semiconductor wafer 5 positioned above a wafer placement device 31, in accordance with some embodiments. The components in FIG. 13 that use the same reference numerals as the components of FIG. 2 refer to the same components or equivalent components thereof. For the sake of brevity, it will not be repeated here. In some embodiments, the wafer placement device 31 includes a plate 32, a heating element 33, the spacers 24, the gap pins 25, the first buffer member 26, the second buffer member 27, and the lid 28. It is appreciated that the features described below can be replaced or eliminated in other embodiments of the wafer placement device 31.

The hot plate 32 may have a circular plan-view shape. The hot plate 32 may include a heating element 33 such as resistive heating elements that raise the temperature of the plate 32 and, thus, the temperature of the semiconductor wafer 5 and photoresist in order to cure and dry the photoresist prior to exposure to finish the application of the photoresist. The spacers 24, the gap pins 25, the first buffer member 26 and the second buffer member 27 are arranged on the plate 32 in a similar manner as those placed on the plate 22. In some embodiments, the first buffer member 26 and the second buffer member 27 are made of thermal resistant material, such as, but not limited to, polyiminde (PI). As a result, a concern that the first buffer member 26 and the second buffer member 27 are deformed due to heat produced in the baking process can be mitigated. Therefore, the function and advantages as those set forth in the embodiment in relation to FIGS. 2-7 are exhibited during the process of the semiconductor wafer 5 in the processing tool 30 and will not be repeated again.

Figure 14:
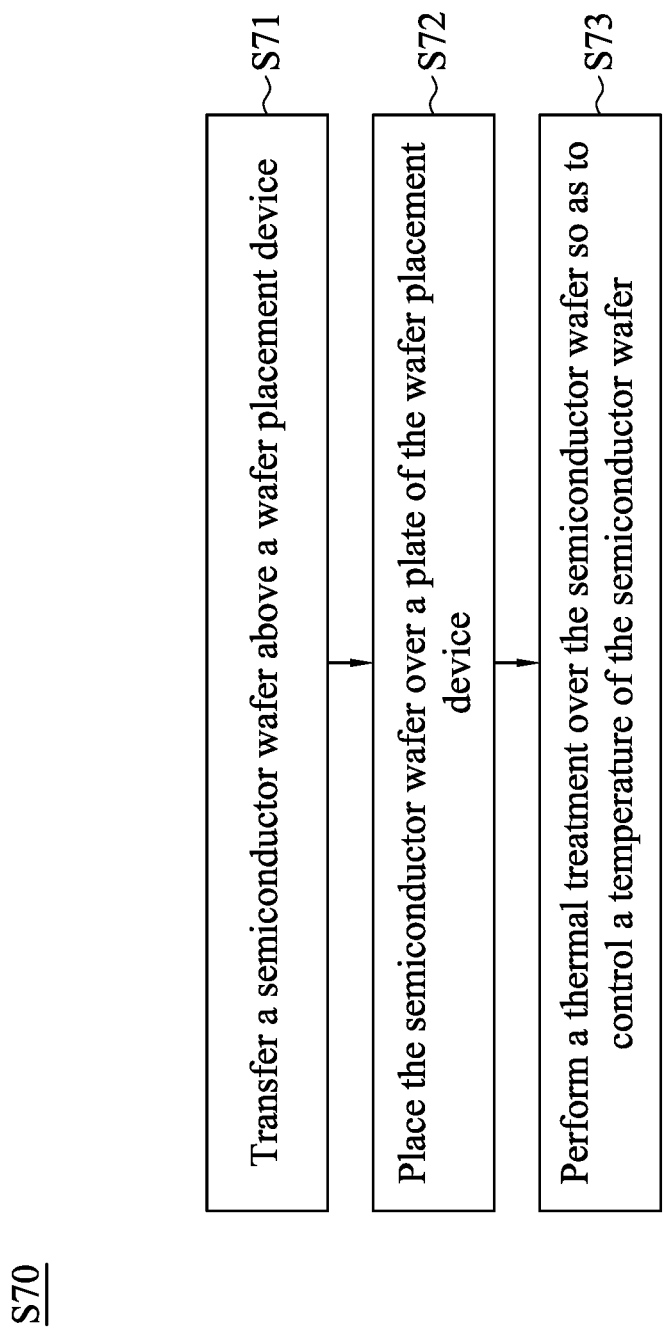
FIG. 14 shows a flow chart of a method for processing a semiconductor wafer, in accordance with some embodiments.

FIG. 14 is a flow chart illustrating a method S70 for processing a semiconductor wafer 5, in accordance with some embodiments. For illustration, the flow chart will be described to accompany the schematic view shown in FIGS. 1, 2 and 5-7. Some of the described stages can be replaced or eliminated in different embodiments. Additional features can be added to the semiconductor device structure. Some of the features described below can be replaced or eliminated in different embodiments.

The method S70 includes operation S71, in which the semiconductor wafer 5 is transferred above a wafer placement device, such as the wafer placement device 21. In some embodiments, as shown in FIG. 2, the semiconductor wafer 5 is moved to a stand-by position above the wafer placement device 21 by the blade portion 17 so that the edge 55 of the semiconductor wafer 5 is aligned with the first buffer member 26 positioned in the peripheral region 203 of the plate 22, and the center 50 of the semiconductor wafer 5 is aligned with the second buffer member 27 positioned in the central region 201 of the plate 22.

In some embodiments, after the semiconductor wafer 5 is moved to the stand-by position, the support pins 217 extend through the through holes 270 of the second buffer member 27 and moves to a lift position, as shown in FIG. 2. In the lift position, the support pins 217 abut again the back surface of the semiconductor wafer 5, and then lift the semiconductor wafer 5 to a higher position so as to separate the semiconductor wafer 5 from the blade portion 17. Afterwards, the blade portion 17 is driven to move outside the processing tool 20.

The method S70 also includes operation S72, in which the semiconductor wafer 5 is placed over the plate 22. In some embodiments, the support pins 217 along with the semiconductor wafer 5 are lowered down so as to place the semiconductor wafer 5 on the gap pins 25, as shown in FIG. 5. If the semiconductor wafer 5 is warped, the semiconductor wafer 5 may also be supported by one of the first buffer member 26 and the second buffer member 27 during the operation S72. For example, when the semiconductor wafer 5 bows itself downwardly, as shown in FIG. 6, the edge 55 of the semiconductor wafer 5 is supported by the first buffer member 26, and the center 50 of the wafer is distant away from the second buffer member 27. On the contrary, when the semiconductor wafer 5 bows itself upwardly, as shown in FIG. 7, the center 50 of the semiconductor wafer 5 is supported by the second buffer member 27, and the edge 55 of the wafer is distant away from the first buffer member 26. Since the semiconductor wafer 5 is not in directly contact with the plate 22, particles generated due to the rubbing of the semiconductor wafer 5 and the plate 22 can be avoided or eliminated.

In some embodiments, as shown in FIG. 4, there is a height difference between the gap pins 25 and the first buffer member 26 or the second buffer member 27. Therefore, when the semiconductor wafer 5 is placed over the plate 22, a point on the semiconductor wafer 5 which is in contact with the gap pins 25 is located at a different level than a point of the semiconductor wafer 5 which is in contact with one of the first buffer member 26 or the second buffer member 27. For example, when the semiconductor wafer 5 bows itself downwardly as shown in FIG. 6, a point Pa on the semiconductor wafer 5 which is in contact with the gap pins 25 is higher than a point Pb of the semiconductor wafer 5 which is in contact with the first buffer member 26. On the contrary, when the semiconductor wafer 5 bows itself downwardly as shown in FIG. 7, a point Pa on the semiconductor wafer 5 which is in contact with the gap pins 25 is lower than a point Pc of the semiconductor wafer 5 which is in contact with the second buffer member 27.

The method S70 also includes operation S73, in which a thermal treatment is performed over the semiconductor wafer 5 so as to regulate a temperature of the semiconductor wafer 5 which is placed over the plate 22. The thermal treatment may include cooling the temperature of the semiconductor wafer 5 or heating the temperature of the semiconductor wafer 5. In some embodiments, as shown in FIG. 5, to cool the semiconductor wafer 5, a coolant is supplied from the coolant source 235 to the coolant loop 234 to chill the plate 22. In addition, gas is supplied from the gas source 233 to the gas conduit 231 to discharge the gas 6 between the semiconductor wafer 5 and the top surface 221 of the plate 22. As a result, the cooling energy from the plate 22 is transferred to the semiconductor wafer 5 through the gas 6. The thermal treatment in operation 73 may include a cooling process that is performed after a vapor deposition of hexamethyldisilizane (HMDS), after a soft baking process, after a post exposure baking process or after a hard baking process. Alternatively, the thermal treatment in operation 73 may include baking process that is performed after the coating of the photoresist (i.e., soft baking process), after an exposure process (i.e., post exposure baking process), after the development process (i.e. hard baking process).

It should be appreciated that, while, in the above descriptions, the wafer placement device 21 is utilized in the implementation of the method S70, it should be noted that the wafer placement device (such as wafer placement devices 21a, 21b, 21c, 21d and 31) shown in other embodiments can be used to realize the same method S70. Furthermore, while the wafer placement device illustrated in the above mentioned embodiments are used for supporting the semiconductor wafer 5 in the lithography process system, the wafer placement device 21 can be implemented any process tool for supporting the semiconductor wafer 5 during any known processes for fabrication of a semiconductor wafer. For example, the wafer placement device 21 may be configured to support a semiconductor wafer 5 in any of a variety of known semiconductor processes, including, for example, physical vapor deposition, dry etching, wet etching, cleaning, polishing, thermal treatment, ion implantation, lithography, chemical vapor deposition, metrology, or any other process which may be performed in a semiconductor processing apparatus.

Embodiments of this disclosure provide a wafer placement device with one or more regions of its top surface, which faces the semiconductor wafer while the semiconductor wafer is placed on the wafer placement device, made of a softer material than the other portion of the top surface of the wafer placement device. By decreasing or eliminating a direct contact between the semiconductor wafer and the wafer placement device, concerns of particles resulted from collision between the semiconductor wafer and the wafer placement device can be mitigated. As a result, a product yield of the semiconductor wafer is improved. Moreover, since the wafer placement device or the semiconductor wafer is protected from being damage, a manufacturing cost is therefore reduced.

In accordance with some embodiments, a method for processing a semiconductor wafer is provided. The method includes transferring the semiconductor wafer above a wafer placement device having a plate to align an edge of the semiconductor wafer with a first buffer member positioned in a peripheral region of the plate and to align a center of the semiconductor wafer with a second buffer member positioned in a central region of the plate. Each of the first buffer member and the second buffer member has a stiffness that is less than that of the plate. The method further includes lowering down the semiconductor wafer to place the semiconductor wafer over the plate.

In accordance with some embodiments, a method for processing a semiconductor wafer is provided. The method includes supporting a semiconductor wafer over a plate with a plurality of gap pins and a first buffer member positioned on the plate. The first buffer member is located at an inner side or an outer side of the plate in a radial direction of the plate, and the first buffer member has a stiffness less than that of the plate. The method further includes controlling a temperature of the semiconductor wafer which is placed over the plate.

In accordance with some embodiments, a wafer placement device is provided. The system includes a plate having a central region, an intermediate region and a peripheral region arranged in sequence in a radial direction of the plate. The wafer placement device also includes a plurality of gap pins located in the intermediate region. The wafer placement device further includes a first buffer member located in one of the central region and the peripheral region. The first buffer member has a stiffness that is less than the plate.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for processing a semiconductor wafer, comprising:
   transferring the semiconductor wafer above a wafer placement device having a plate to align an edge of the semiconductor wafer with a first buffer member positioned in a peripheral region of the plate and to align a center of the semiconductor wafer with a second buffer member positioned in a central region of the plate, wherein the first buffer member has a ring shape and surrounds gap pins that are adjacent to the first buffer member and fixed on a top surface of the plate, each of the first buffer member and the second buffer member has a stiffness that is less than that of the plate, and the first buffer member and the second buffer member are respectively fixed in a first groove and a second groove, which partially protrude from the top surface of the plate, in a tight-fit configuration; and
   lowering down the semiconductor wafer to place the semiconductor wafer over the plate until the semiconductor wafer is in contact with the top surface of one of the first buffer member and the second buffer member and is distant away from the other one of first buffer member and the second buffer member.

2. The method of claim 1, wherein when the semiconductor wafer is placed over the plate, the semiconductor wafer is supported by the gap pins positioned between the first buffer member and the second buffer member.

3. The method of claim 2, wherein a point on the semiconductor wafer which is in contact with one of the gap pins is located at a different level than a point of the semiconductor wafer which is in contact with the one of the first buffer member and the second buffer member.

4. The method of claim 1, further comprising, after the semiconductor wafer is transferred above the wafer placement device, placing the semiconductor wafer on a lift pin which extending through a through hole formed in the first buffer member;
   wherein the lowering down the semiconductor wafer is performed by decreasing a height of the lift pin.

5. The method of claim 1, further comprising performing a thermal treatment over the semiconductor wafer when the semiconductor wafer is placed over the plate.

6. The method of claim 5, wherein the thermal treatment comprises heating or cooling the semiconductor wafer.

7. A method for processing a semiconductor wafer, comprising:
   supporting a semiconductor wafer over a plate with a plurality of gap pins and a first buffer member positioned on the plate, wherein the first buffer member is located at an inner side or an outer side of the plate in a radial direction of the plate, and the first buffer member has a less stiffness than the plate, wherein the gap pins are separately fixed on a top surface of the plate and adjacent to the first buffer member, and the first buffer member is fixed in a groove, which partially protrudes from the top surface of the plate, in a tight-fit configuration, wherein a top surface of the first buffer member is lower than top surfaces of the gap pins; and controlling a temperature of the semiconductor wafer which is placed over the plate.

8. The method of claim 7, wherein a point on the semiconductor wafer which is in contact with one of the gap pins is located at a different level than a point of the semiconductor wafer which is in contact with the first buffer member.

9. The method of claim 7, wherein when the semiconductor wafer is placed over the plate, the semiconductor wafer is distant away from a second buffer member positioned on the plate, wherein one of the gap pins is located, in the radial direction, between the first buffer member and the second buffer member.

10. The method of claim 7, further comprising trapping a gas between the semiconductor wafer and the plate by the first buffer member which is located at the outer side of the plate and surrounds the plate.

11. The method of claim 10, wherein during the control of the temperature of the semiconductor wafer, the gas is thermally conductive so as to transfer the heat between the semiconductor wafer and the plate.

12. The method of claim 7, wherein the controlling the temperature of the semiconductor wafer comprises heating or cooling the semiconductor wafer.

13. A wafer placement device, comprising:
a plate having a central region, an intermediate region and a peripheral region arranged in sequence in a radial direction of the plate;
a plurality of gap pins separately located in the intermediate region and fixed on a top surface of the plate; and
a first buffer member located in one of the central region and the peripheral region, wherein the first buffer member has a stiffness that is less than that of the plate, and the first buffer member is fixed in a groove, which partially protrudes from the top surface of the plate, in a tight-fit configuration, and the gap pins are arranged adjacent to the first buffer member,
wherein a top surface of the first buffer member is lower than top surfaces of the gap pins.

14. The wafer placement device of claim 13, further comprising a second buffer member located in the other one of the central region and the peripheral region, wherein the second buffer member has a stiffness less than that of the plate.

15. The wafer placement device of claim 14, wherein the semiconductor wafer is in contact with one of the first buffer member and away from the second buffer member and is distant away from the other one of first buffer member and away from the second buffer member.

16. The wafer placement device of claim 13, further comprising a lift pin, wherein the first buffer member is located in the central region of the plate, and the lift pin is positioned within a through hole formed in the first buffer member.

17. The wafer placement device of claim 13, wherein the first buffer member is located in the peripheral region and surrounds the plate.

18. The wafer placement device of claim 13, wherein a height of the gap pin is greater than a height of the first buffer member relative to the top surface of the plate.

19. The wafer placement device of claim 13, wherein a top surface of the first buffer member is higher than or is located at the same level with the top surface of the plate.

20. The wafer placement device of claim 13, wherein the first buffer member is made of material selected from polyimide.

* * * * *